(12) United States Patent
Fenwick et al.

(10) Patent No.: US 9,735,240 B2
(45) Date of Patent: Aug. 15, 2017

(54) HIGH ELECTRON MOBILITY TRANSISTOR (HEMT)

(71) Applicant: Toshiba Corporation, Minato-ku, Tokyo (JP)

(72) Inventors: William Fenwick, Livermore, CA (US); Dong Lee, Dubin, CA (US); Long Yang, Union City, CA (US)

(73) Assignee: Toshiba Corporation, Tokyo (JP)

( * ) Notice: Subject to any disclaimer, the term of this patent is extended or adjusted under 35 U.S.C. 154(b) by 0 days.

(21) Appl. No.: 14/976,379

(22) Filed: Dec. 21, 2015

(65) Prior Publication Data

US 2017/0179271 A1    Jun. 22, 2017

(51) Int. Cl.

| | |
|---|---|
| *H01L 29/207* | (2006.01) |
| *H01L 29/778* | (2006.01) |
| *H01L 29/20* | (2006.01) |
| *H01L 29/205* | (2006.01) |
| *H01L 29/08* | (2006.01) |
| *H01L 29/66* | (2006.01) |
| *H01L 29/201* | (2006.01) |

(52) U.S. Cl.
CPC ........ *H01L 29/207* (2013.01); *H01L 29/0843* (2013.01); *H01L 29/201* (2013.01); *H01L 29/2003* (2013.01); *H01L 29/205* (2013.01); *H01L 29/66462* (2013.01); *H01L 29/7787* (2013.01)

(58) Field of Classification Search
CPC ............. H01L 29/7787; H01L 29/2003; H01L 29/201; H01L 29/205; H01L 29/207; H01L 29/66462
See application file for complete search history.

(56) References Cited

U.S. PATENT DOCUMENTS

| | | | | |
|---|---|---|---|---|
| 2007/0045670 | A1* | 3/2007 | Kuraguchi | H01L 29/7787 257/249 |
| 2010/0019277 | A1* | 1/2010 | Hata | H01L 29/7783 257/190 |
| 2012/0025205 | A1* | 2/2012 | Nakata | H01L 21/02378 257/77 |
| 2013/0181224 | A1* | 7/2013 | Lim | H01L 29/7786 257/76 |

OTHER PUBLICATIONS

Webb et al (1999), Semi-insulating C-doped GaN and high-mobility AlGaN/GaN heterostructures grown by ammonia molecular beam epitaxy, Applied Physics Letters, 75(7), 953-955.*

* cited by examiner

*Primary Examiner* — Fei Fei Yeung Lopez

(74) *Attorney, Agent, or Firm* — White & Case LLP

(57) ABSTRACT

A high electron mobility transistor (HEMT) device with a highly resistive layer co-doped with carbon (C) and a donor-type impurity and a method for making the HEMT device is disclosed. In one embodiment, the HEMT device includes a substrate, the highly resistive layer co-doped with C and the donor-type impurity formed above the substrate, a channel layer formed above the highly resistive layer, and a barrier layer formed above the channel layer. In one embodiment, the highly resistive layer comprises gallium nitride (GaN). In one embodiment, the donor-type impurity is silicon (Si). In another embodiment, the donor-type impurity is oxygen (O).

41 Claims, 8 Drawing Sheets

HIGH ELECTRON MOBILITY TRANSISTOR (HEMT)

FIELD OF THE INVENTION

The invention relates generally to high electron mobility transistors (HEMTs), and particularly to HEMTs with a high-resistivity gallium nitride layer co-doped with carbon and a donor-type impurity.

BACKGROUND OF THE INVENTION

The high electron mobility transistor (HEMT) is a type of field effect transistor (FET) in which a hetero-junction between a channel layer and a barrier layer whose electron affinity is smaller than that of the channel layer. A two-dimensional electron gas (2DEG) forms in the channel layer of a group III-V HEMT device due to the mismatch in polarization field at the channel-barrier layer interface. The 2DEG has a high electron mobility that facilitates high-speed switching during device operation. In typical depletion-mode HEMT devices (also known as normally-on devices), a negatively-biased voltage may be applied to the gate electrode to deplete the 2DEG and thereby turn off the device. A group III-V HEMT device is one made of materials in column III of the periodic table, such as aluminum (Al), gallium (Ga), and indium (In), and materials in column V of the periodic table, such as nitrogen (N), phosphorus (P), and arsenic (As).

Group III-Nitride HEMT devices are especially suited for power electronics end-applications operating under voltage and current conditions that cannot be achieved with conventional silicon (Si)-based transistor devices. In order to suppress leakage current and to sustain high voltages without breaking down, group III-Nitride HEMT devices typical employ a highly resistive layer underlying the channel layer. The highly resistive layer commonly comprises a layer of gallium nitride (GaN) doped with carbon (C) or iron (Fe), with C doping being the most typical approach. However, doping GaN with C or Fe introduces defects in the material, which results in an increase in the on-resistance of the HEMT device when stressed at a high voltage. This changing on-resistance is known as current collapse, and it is one problem hindering the widespread adoption of group III-Nitride HEMT devices today.

FIG. 1 shows a plot of the current collapse ratio of an HEMT device containing a highly resistive C-doped GaN layer as a function of the thickness of the highly resistive layer. The current collapse ratio is the ratio of the measured on-resistance of the HEMT device after applying a high voltage compared to the measured on-resistance of the HEMT device before applying a high voltage. 200V is applied to the gate of the HEMT device of FIG. 1 to measure the current collapse ratio. As shown in FIG. 1, the current collapse ratio in the HEMT device is directly proportional to the amount of C-doped GaN incorporated into the HEMT device.

When there is no C-doped GaN in the HEMT device, the current collapse ratio is about 1, or in other words, the on-resistance of the HEMT device changed little, if at all, after 200V was applied to the gate of the HEMT device. Conversely, when the HEMT device has a C-doped GaN layer having a thickness of 3 µm, the measured current collapse ratio increases to about 1.2 to 1.3, or a 20% to 30% increase in the on-resistance of the HEMT device after 200V was applied to the gate.

There is, therefore, an unmet demand for HEMT devices that suppress the current collapse caused by C doping in the highly resistive layer while maintaining low leakage current and high breakdown voltage characteristics.

BRIEF DESCRIPTION OF THE INVENTION

In one embodiment, a high electron mobility transistor (HEMT) device includes a substrate and a highly resistive layer formed above the substrate. The HEMT device further includes a channel layer formed above the highly resistive layer and a barrier layer formed above the channel layer. The highly resistive layer is co-doped with carbon (C) and a donor-type impurity. In one embodiment, the highly resistive layer has an average concentration of the donor-type impurity that is $5 \times 10^{15}$ atoms/cm$^3$ or more throughout the highly resistive layer. The ratio of the average concentration of the donor-type impurity compared to an average concentration of C throughout the highly resistive layer is greater than 1:1000, and less than 1:1. In one embodiment, the highly resistive layer has a sheet resistance greater than 2300 Ohms/sq.

The HEMT device is a group III-V device. In one embodiment, the highly resistive layer comprises gallium nitride (GaN). In one embodiment, the channel layer comprises GaN. In one embodiment, the barrier layer comprises aluminum gallium nitride (AlGaN). In one embodiment, the highly resistive layer has a thickness between 0.25 µm and 6 µm. In one embodiment, the channel layer has a thickness between 120 nm and 4 µm. In the embodiment where the barrier layer comprises AlGaN, the barrier layer may have a thickness and a concentration of aluminum (Al) corresponding to a charge density in the channel layer between $5.5 \times 10^{12}$ C/cm$^2$ to $8 \times 10^{12}$ C/cm$^2$.

In one embodiment, the donor-type impurity is silicon (Si). In another embodiment, the donor-type impurity is oxygen (O). In one embodiment, the highly resistive layer has a substantially uniform concentration of the donor-type impurity throughout the highly resistive layer, with a variance of the concentration of the donor-type impurity being less than 15% throughout the highly resistive layer. In another embodiment, the highly resistive layer has a concentration of the donor-type impurity that is higher at an upper surface of the highly resistive layer facing the channel layer than the average concentration of the donor-type impurity throughout the highly resistive layer. In yet another embodiment, the highly resistive layer has a concentration of the donor-type impurity that is higher at a lower surface of the highly resistive layer facing the substrate than the average concentration of the donor-type impurity throughout the highly resistive layer.

In one embodiment, the HEMT device further includes a buffer layer between the substrate and the highly resistive layer. In this embodiment, the buffer layer may comprise AlGaN, aluminum nitride (AlN), or any other suitable material for growing high quality layers of group III-V materials, or combinations thereof. In one embodiment, the buffer layer has a thickness between 150 Å and 40,000 Å. In yet another embodiment, the HEMT device further includes a layer of GaN between the substrate and the highly resistive layer. In one embodiment, the layer of GaN has a thickness up to 1 µm.

In one embodiment, the HEMT device further includes a source electrode electrically coupled to the barrier layer, a drain electrode electrically coupled to the barrier layer, and a gate electrode electrically coupled to the barrier layer between the source and drain electrodes. The source and drain electrodes may comprise any material suitable to form an ohmic contact with the barrier layer, such as aluminum (Al), Si, titanium (Ti), nickel (Ni), tungsten (W), or any combination or alloy thereof. The gate electrode forms a non-ohmic contact with the barrier layer, and may comprise any suitable material, including Ti. Ni, Al, W, molybdenum (Mo), or any combination or alloy thereof.

In one embodiment, a method of forming a HEMT device includes forming a highly resistive layer co-doped with C and a donor-type impurity above a substrate. The method further includes forming a channel layer above the highly resistive layer and forming a barrier layer above the channel layer. In one embodiment, the donor-type impurity has an average concentration of $5 \times 10^{15}$ atoms/cm$^3$ or more throughout the highly resistive layer. The ratio of the average concentration of the donor-type impurity compared to an average concentration of C throughout the highly resistive layer is greater than 1:1000, and less than 1:1. In one embodiment, the highly resistive layer has a sheet resistance greater than 2300 Ohms/sq.

The highly resistive layer, channel layer, and barrier layer may be formed by any suitable method, including metal organic chemical vapor deposition (MOCVD) or molecular beam epitaxy (MBE). In one embodiment, the highly resistive layer comprises GaN. In one embodiment, the channel layer comprises GaN. In one embodiment, the barrier layer comprises AlGaN. In one embodiment, the highly resistive layer is grown to a thickness between 0.25 µm and 6 µm. In one embodiment, the channel layer is grown to a thickness between 120 nm and 4 µm. In the embodiment where the barrier layer comprises AlGaN, the barrier layer may be grown to a thickness and have a concentration of Al corresponding to a charge density in the channel layer between $5.5 \times 10^{12}$ C/cm$^2$ to $8 \times 10^{12}$ C/cm$^2$.

In one embodiment, the highly resistive layer is grown in conditions such that C incorporation in the highly resistive layer is promoted while simultaneously introducing the donor-type impurity. The growth conditions include a low ratio of group V precursors to group III precursors, low temperature and pressure, and a high growth rate. In one embodiment, the highly resistive layer is grown using a ratio of group V precursors to group III precursors between 200 to 1400. In one embodiment, the highly resistive layer is grown at a pressure between 25 torr and 150 torr. In one embodiment, the highly resistive layer is grown at a temperature (measured at the wafer) between 900° C. and 1100° C. In one embodiment, the highly resistive layer is grown at a rate between 5 µm/hr and 91 µm/hr. In one embodiment, the donor-type impurity is Si and is introduced into the highly resistive layer by injecting silane (SiH$_4$) while growing the highly resistive layer. In another embodiment, the donor-type impurity is O.

In one embodiment, the highly resistive layer is formed to have a variance of a concentration of the donor-type impurity less than 15% throughout the highly resistive layer. In another embodiment, the highly resistive layer is formed to have a concentration of the donor-type impurity that is higher at an upper surface of the highly resistive layer facing the channel layer than the average concentration of the donor-type impurity throughout the highly resistive layer. In yet another embodiment, the highly resistive layer is formed to have a concentration of the donor-type impurity that is higher at a lower surface of the highly resistive layer facing the substrate than the average concentration of the donor-type impurity throughout the highly resistive layer.

In one embodiment, the method further includes forming a buffer layer between the substrate and the highly resistive layer. In this embodiment, the buffer layer may comprise AlGaN, AlN, or any other suitable material for growing high quality layers of group III-V materials, or combinations thereof. In one embodiment, the buffer layer is grown to a thickness between 150 Å and 40,000 Å. In yet another embodiment, the method further includes growing a layer of GaN between the substrate and the highly resistive layer. In one embodiment, the layer of GaN is grown to a thickness up to 1 µm.

In one embodiment, the method further includes forming a source electrode electrically coupled to the barrier layer, forming a drain electrode electrically coupled to the barrier layer, and forming a gate electrode electrically coupled to the barrier layer between the source and drain electrodes. The source and drain electrodes may comprise any material suitable to form an ohmic contact with the barrier layer, such as Al, Si, Ti, Ni, W, or any combination or alloy thereof. The gate electrode forms a non-ohmic contact with the barrier layer, and may comprise any suitable material, including Ti, Ni, Al, W, Mo, or any combination or alloy thereof.

DETAILED DESCRIPTION OF THE INVENTION

Figure 1:
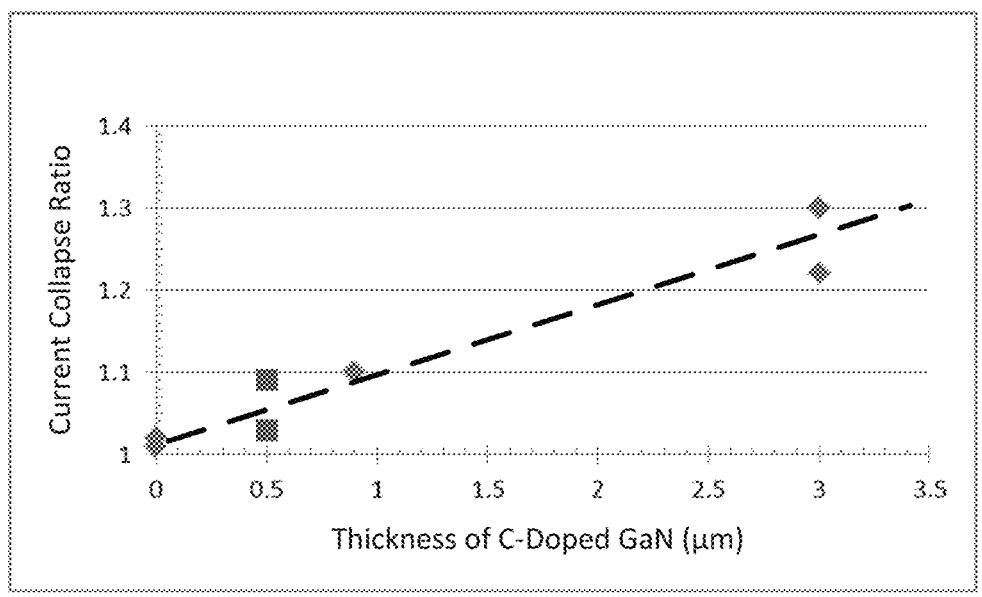
FIG. 1 shows a plot of the current collapse ratio of an HEMT device containing a highly resistive C-doped GaN layer as a function of the thickness of the highly resistive layer.
Figure 2:
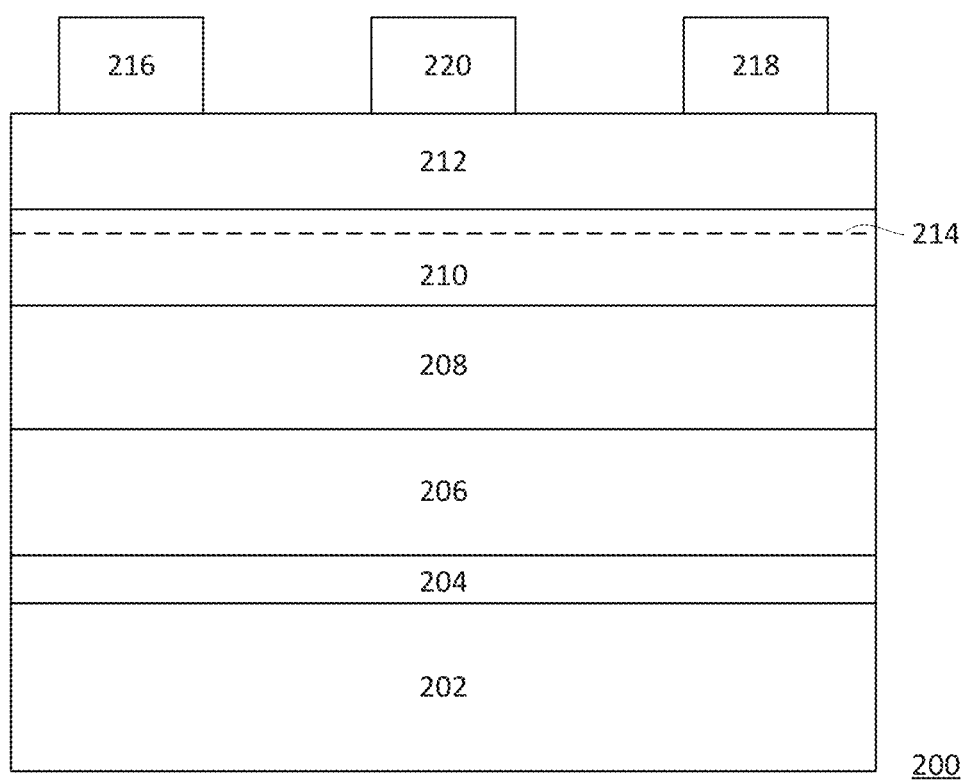
FIG. 2 shows a cross-sectional view of an HEMT device containing a highly resistive layer co-doped with C and a donor-type impurity, according to one embodiment of the invention.

FIG. 2 shows a cross-sectional view of an HEMT device containing a highly resistive layer co-doped with C and a donor-type impurity, according to one embodiment of the invention. In FIG. 2, HEMT device 200 begins with a substrate 202. Substrate 202 can be silicon (Si), silicon carbide (SiC), sapphire ($Al_2O_3$), bulk GaN, or any other suitable substrate for epitaxially growing a group III-V material. A buffer layer 204 is formed on substrate 202 to provide a surface suitable for growing high-quality layers of group III-V materials. Buffer layer 204 can be GaN, aluminum gallium nitride (AlGaN), aluminum nitride (AlN), or any other suitable material for growing high-quality layers of group III-V materials, or combinations thereof. In one embodiment, the buffer layer 204 has a thickness between 150 Å and 40,000 Å.

A GaN layer 206 is formed on the buffer layer 204. In one embodiment, the GaN layer 206 is un-doped. The GaN layer 206 is optional (it provides a high-quality surface to form subsequent layers of the HEMT device 200), and in one embodiment, subsequent layers of the HEMT device 200 are formed directly on the buffer layer 204. In one embodiment, the GaN layer 206 has a thickness up to 1 μm.

A highly resistive layer 208 is formed on the GaN layer 206. The highly resistive layer 208 is co-doped with C and a donor-type impurity. In one embodiment, the donor-type impurity comprises Si. In another embodiment, the donor type impurity comprises oxygen (O). The highly resistive layer 208 comprises a group III-V material. In one embodiment, the highly resistive layer 208 comprises GaN. By co-doping the highly resistive layer 208 with C and a donor-type impurity, such as Si or O, the donor-type impurity changes the nature of the highly resistive layer 208 by suppressing the formation of undesirable defects introduced by C doping in the highly resistive layer 208 that lead to current collapse. This is because C can incorporate in a group III-V material as either a desirable acceptor-type defect or as an undesirable donor-type defect.

For example, C can incorporate in GaN either as an acceptor-type on an N site ($C_N$) or as a donor-type on a Ga ($C_{Ga}$). Incorporation of C as an acceptor-type defect is desired to produce highly resistive material. However, the more $C_N$ that is formed, the closer the Fermi level ($E_F$) in the material moves closer to the valence band maximum, and increases the likelihood that undesirable Cc, is formed. The incorporation of a donor-type impurity, such as Si or O, by co-doping the highly resistive layer 208 can hold the $E_F$ further from the valence band, thus decreasing the formation energy required to form $C_N$. In other words, co-doping with a donor-type impurity, such as Si or O, suppresses formation of other donor-type defects, such as $C_{Ga}$. This increases the amount of desirable $C_N$ formed, and correspondingly reduces the amount of undesirable $C_{Ga}$ formed, for a given concentration of C doping in the highly resistive layer 208.

Because a donor-type impurity incorporates as a defect that is positively charged, and C desirably incorporates as a defect that is negatively charged in the highly resistive layer 208, there is a trade-off between the amount of the donor-type impurity that can be incorporated and the amount of C that can be incorporated in the highly resistive layer 208. If the concentration of the donor-type impurity is too high in the highly resistive layer 208 compared to the concentration of C, the highly resistive layer 208 will become conductive, increasing the leakage current and reducing the breakdown voltage of the HEMT device 200, and defeating the purpose of incorporating the highly resistive layer 208 in the HEMT device 200.

Figure 3:
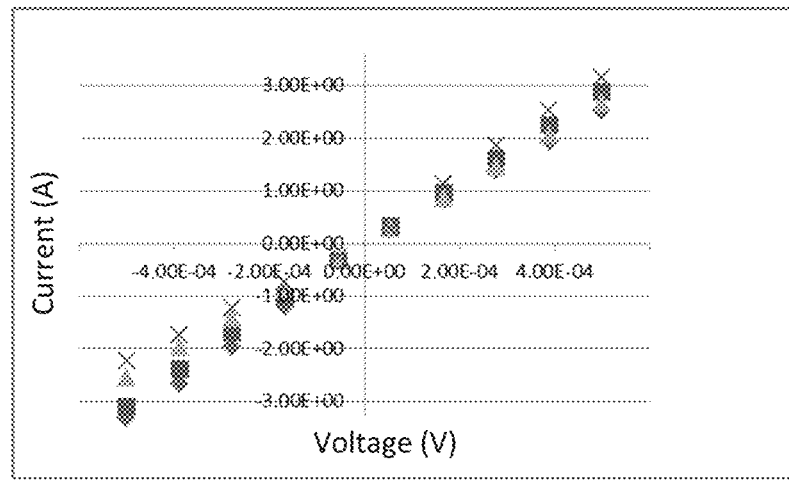
FIG. 3 shows a plot of the I-V characteristics of a GaN layer co-doped with an average concentration of C equal to an average concentration of a donor-type impurity.
Figure 4:
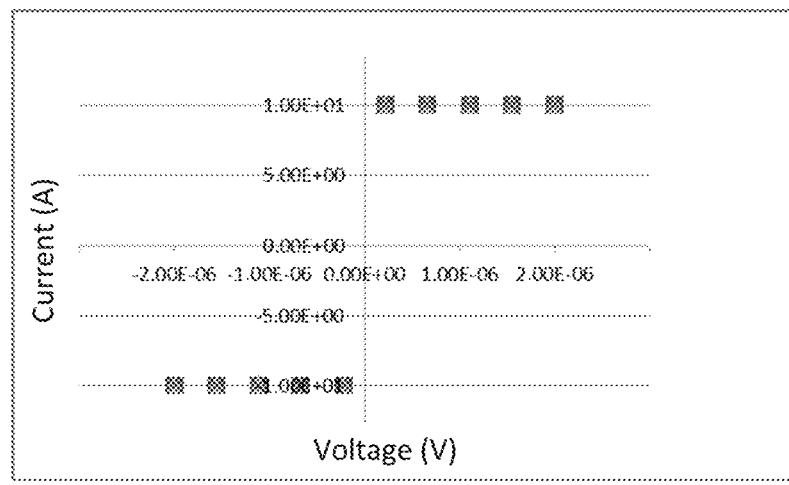
FIG. 4 shows a plot of the I-V characteristics of a highly resistive GaN layer co-doped with an average concentration of C greater than an average concentration of a donor-type impurity, according to one embodiment of the invention.

For example, FIG. 3 shows a plot of the I-V characteristics of a GaN layer co-doped with an average concentration of C equal to an average concentration of a donor-type impurity. In FIG. 3, the co-doped GaN layer has an average C concentration of $1\times10^{18}$ atoms/$cm^3$ and an average Si concentration of $1\times10^8$ atoms/$cm^3$. As shown in FIG. 3, the I-V plot is linear, indicating that the co-doped GaN layer is conductive. In contrast, FIG. 4 shows a plot of the I-V characteristics of a highly resistive GaN layer co-doped with an average concentration of C greater than an average concentration of a donor-type impurity, according to one embodiment of the invention. In FIG. 4, the co-doped GaN layer has an average C concentration of $1\times10^{18}$ atoms/$cm^3$ and an average Si concentration of $1\times10^{17}$ atoms/$cm^3$. As shown in FIG. 4, the I-V plot resembles a step function, indicating that co-doped GaN layer is highly resistive.

To evaluate the effect on the electrical characteristics of the GaN layer as a result of co-doping with C and Si, a Hall measurement was taken to measure the sheet resistance (Ohms/sq) and carrier concentration (C/$cm^3$) of the GaN layer at various concentrations of C and Si:

TABLE 2-1

| Si (Atoms/$cm^3$) | C (Atoms/$cm^3$) | Carrier Concentration (C/$cm^3$) | Sheet Resistance (Ohms/sq) |
|---|---|---|---|
| $5\times10^{16}$ | 0 | $5\times10^{16}$ | 900 |
| $5\times10^{16}$ | $1\times10^{18}$ | N/A | Too high for measurement |
| $1\times10^{17}$ | 0 | $1\times10^{17}$ | 400 |
| $1\times10^{17}$ | $1\times10^{18}$ | N/A | Too high for measurement |
| $2\times10^{17}$ | $1\times10^{18}$ | N/A | Too high for measurement |
| $5\times10^{17}$ | $1\times10^{18}$ | N/A | 1,373,000 |
| $1\times10^{18}$ | $1\times10^{18}$ | $1.5\times10^{17}$ | 2,300 |

As shown in Table 2-1, when the average concentration of Si is equal to, or greater than, the average concentration of C in the GaN layer, the GaN layer has a measureable concentration of carriers, indicating the GaN layer is conductive. In contrast, when the average concentration of C is greater than the average concentration of Si, the GaN layer is devoid of any material concentration of carriers, and as a result, the sheet resistance of the GaN layer is too high for the Hall measurement.

Referring back to FIG. 2, in one embodiment, the highly resistive layer 208 has an average concentration of C that is $5\times10^{16}$ atoms/$cm^3$ or more throughout the highly resistive layer 208. In one embodiment, the highly resistive layer 208 has an average concentration of the donor-type impurity that is $5\times10^{15}$ atoms/$cm^3$ or more throughout the highly resistive layer 208. The ratio of the average concentration of the donor-type impurity compared to an average concentration of C throughout the highly resistive layer 208 is greater than 1:100, and less than 1:1. In one embodiment, the highly resistive layer 208 has a sheet resistance greater than 2300 Ohms/sq.

In one embodiment, the concentration of the donor-type impurity is substantially uniform throughout the highly resistive layer 208. In one embodiment, the variance of the concentration of the donor-type impurity is less than 15% throughout the highly resistive layer 208. In one embodiment, the concentration of the donor-type impurity is higher at the upper surface of the highly resistive layer 208 than the average concentration of the donor-type impurity throughout the highly resistive layer 208. In another embodiment, the concentration of the donor-type impurity is higher at the lower surface of the highly resistive layer 208 than the average concentration of the donor-type impurity throughout the highly resistive layer 208. In one embodiment, the highly resistive layer 208 has a thickness between 0.25 μm and 6 μm.

A channel layer 210 is formed on the highly resistive layer 208. The channel layer 210 comprises a group III-V material. In one embodiment, the channel layer 210 comprises GaN. In one embodiment, the channel layer 210 is un-doped. In one embodiment, the channel layer 210 has a thickness between 120 nm and 4 μm. A barrier layer 212 is formed on the channel layer 210. The barrier layer 212 comprises a material suitable for forming a heterojunction with the channel layer 210. The resulting difference in the polar properties between the semiconductor material of the channel layer 210 and the barrier layer 212 give rise to a fixed charged at their interface, or heterojunction. The fixed charge attracts mobile electrons in the HEMT device 200 resulting in a 2DEG 214 at the heterojunction.

The material and thickness of the barrier layer 212 is preferably selected to achieve a charge density in the 2DEG 214 between $5.5 \times 10^{12}$ C/cm$^2$ to $8 \times 10^{12}$ C/cm$^2$. For example, in one embodiment, the channel layer 210 comprises GaN and the barrier layer 212 comprises AlGaN. The barrier layer 212 has an Al composition of 21%, and a thickness of 300 Å. In other embodiments, the Al composition of the barrier layer 212 may be greater than 21%, in which case the thickness of the barrier layer 212 may be made thinner than 300 Å to achieve a charge density in the 2DEG 214 between $5.5 \times 10^{12}$ C/cm$^2$ to $8 \times 10^{12}$ C/cm$^2$. And conversely, when the Al composition of the barrier layer 212 is lower than 21%, the thickness of the barrier layer 212 may be made thicker than 300 Å to achieve the desired charge density in the 2DEG 214.

A source electrode 216 and drain electrode 218 are formed on top of the barrier layer 212 and electrically coupled to the barrier layer 212. A gate electrode 220 is formed between the source electrode 216 and the drain electrode 218. The gate electrode 220 is also electrically coupled to the barrier layer 212. Source electrode 216 and drain electrode 218 may comprise any material suitable to form an ohmic contact with the barrier layer 212, such as Al, Si, titanium (Ti), nickel (Ni), tungsten (W), or any combination or alloy thereof. The gate electrode 220 forms a non-ohmic contact (a contact which does not exhibit linear I-V characteristics) with the barrier layer 212. The gate electrode 220 may comprise any suitable material, including Ti, Ni, Al, W, molybdenum (Mo), or any combination or alloy thereof.

During device operation of the HEMT device 200, a 2DEG 214 forms in the channel layer 210, allowing current to flow between the source electrode 216 and the drain electrode 218.

Co-doping the highly resistive layer 208 with C and a donor-type impurity provides an additional degree of control over the electrical properties of the highly resistive layer 208 that is not available with the standard C doping alone. The ability to force a higher percentage of C to incorporate in the desired fashion (as an acceptor-type defect) within the highly resistive layer 208 by co-doping with the highly resistive layer 208 with a donor-type impurity opens up a wider process window for the epitaxial growth of the highly resistive layer 208. C is typically incorporated into the highly resistive layer 208 under conditions that yield a low-quality material. Co-doping the highly resistive layer 208, however, improves the efficiency of the C that is incorporated (i.e. more C is incorporated as a desired acceptor-type), so less overall C is required to form the highly resistive layer 208. Thus, co-doping with C and a donor-type impurity allows the epitaxial growth of the highly resistive layer 208 to be done under conditions that result in a higher quality material, improving the quality of the highly resistive layer 208.

The improved quality of the highly resistive layer 208 and the suppression of undesirable defects in the highly resistive layer 208 results in an HEMT device 200 that has substantially improved current collapse ratios compared to conventional HEMT devices without a highly resistive layer 208 co-doped with C and a donor-type impurity.

Figure 5:
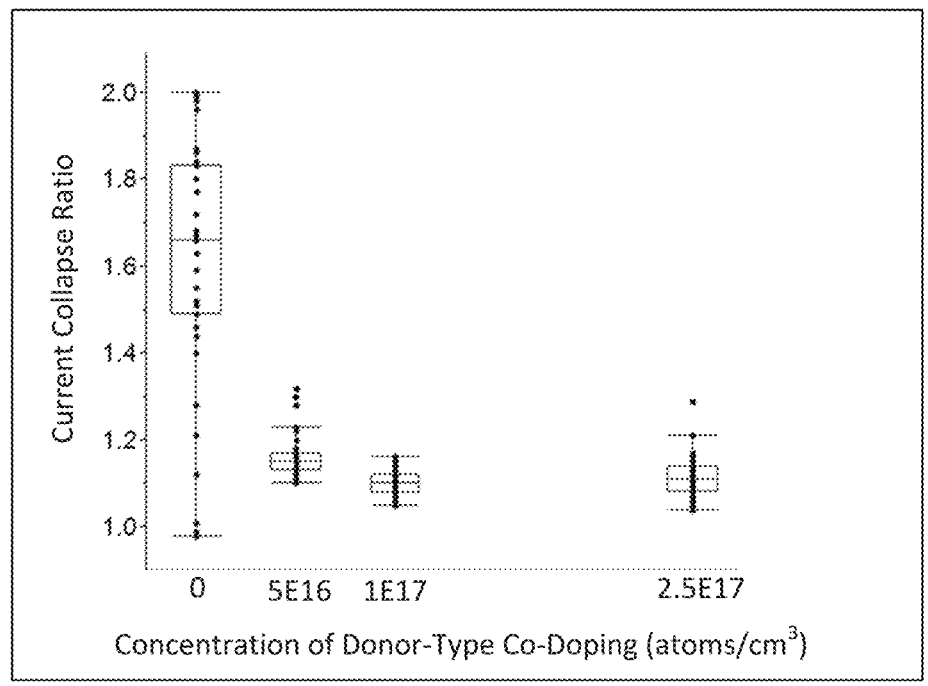
FIG. 5 shows a plot of the current collapse ratio of a plurality of HEMT devices containing a highly resistive GaN layer co-doped with C and varying concentrations of a donor-type impurity, according to one embodiment of the invention.

This is illustrated in FIG. 5, which shows a plot of the current collapse ratio of a plurality of HEMT devices containing a highly resistive GaN layer co-doped with C and varying concentrations of a donor-type impurity, according to one embodiment of the invention. In FIG. 5, the plurality of HEMT devices each contain a highly resistive GaN layer with an average concentration of C of $1 \times 10^{18}$ Atoms/cm$^3$ and average concentrations of a donor-type co-dopant, Si, of zero (no intentional donor-type co-doping), $5 \times 10^{16}$ Atoms/cm$^3$, $1 \times 10^{17}$ Atoms/cm$^3$, and $2.5 \times 10^{17}$ Atoms/cm$^3$. Of course, it is understood that even if the highly resistive GaN layer is not intentionally doped with Si, some Si may be incorporated into the highly resistive GaN layer from the manufacturing environment.

As shown in FIG. 5, the HEMT devices that have no intentional Si co-doping in the highly resistive layer have varying current-collapse ratios, some of which are as high as 2.0, meaning the on-resistance of the HEMT device is doubled after applying a high voltage to the gate of the HEMT device. The average current-collapse ratio of the HEMT devices that have no intentional Si co-doping in the highly resistive layer is about 1.65, with the 25$^{th}$ percentile at about 1.85 and the 25$^{th}$ percentile at about 1.5. The wide disparity between the current collapse ratios of the HEMT devices that have no concentration of Si in the highly resistive layer makes these devices particularly unsuitable for use in commercial products which requires consistency across the HEMT devices utilized in a device in order to function, not to mention the greatly increased on-resistance of the HEMT devices reduces the operating efficiency of the device.

The HEMT devices that have an average Si co-doping concentration of $5 \times 10^{16}$ Atoms/cm$^3$, $1 \times 10^{17}$ Atoms/cm$^3$, and $2.5 \times 10^{17}$ Atoms/cm$^3$ in the highly resistive layer, all show a dramatic improvement in both the average current collapse ratio (about 1.16, 1.1, and 1.15, respectively) and the variation of the current collapse ratio across the plurality of HEMT devices as compared to the HEMT devices that have no concentration of Si in the highly resistive layer. As shown in FIG. 5, the HEMT devices with an average Si co-doping concentration of $1 \times 10^{17}$ Atoms/cm$^3$ in the high-resistivity layer best suppresses current collapse when the average concentration of C in the high resistivity layer is $1 \times 10^{18}$ Atoms/cm$^3$, with an average current collapse ratio of 1.1, and a variation of about 0.1 between the lowest and highest current collapse ratio. The relatively low current collapse ratio and small variation between the current collapse ratio indicates that HEMT devices with Si co-doping in the highly resistive layer may be consistently manufactured, with the devices having similar electrical properties, making them suitable for mass manufacturing and incorporation into commercial end products, and may replace traditional Si-based transistor devices.

Figure 6:
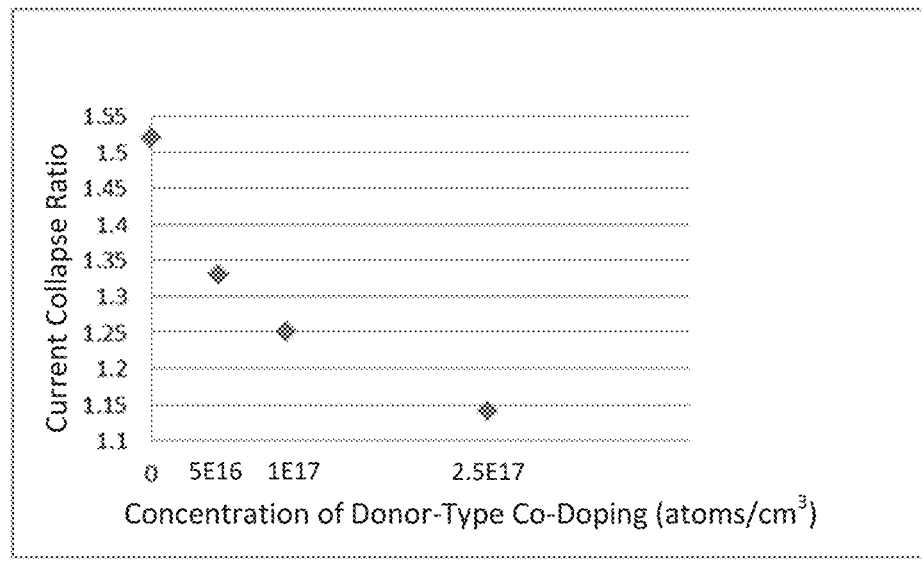
FIG. 6 shows a plot of the current-collapse ratio of an HEMT device containing a highly resistive GaN layer co-doped with C and a donor-type impurity as a function of the concentration of a donor-type impurity.

FIG. 6 shows a plot of the current-collapse ratio of an HEMT device containing a highly resistive GaN layer co-doped with C and a donor-type impurity as a function of the concentration of a donor-type impurity. The data points illustrated in FIG. 6 represent a wafer median measurement of current collapse for a couple dozen HEMT devices formed across a wafer. As with FIG. 5, the HEMT devices each contain a highly resistive layer doped with an average concentration of C of $1 \times 10^{18}$ atoms/cm$^3$, and varying average concentrations of a donor-type impurity, Si, of $5 \times 10^{16}$ atoms/cm$^3$, $1 \times 10^{17}$ atoms/cm$^3$, and $2.5 \times 10^{17}$ atoms/cm$^3$.

As shown in FIG. 6, as the average concentration of co-doping with the donor-type impurity increased in the highly resistive layer, the median current collapse ratio decreased for the HEMT devices formed across the wafer—falling from a current collapse ratio of 1.525 for the HEMT devices with no donor-type impurity in the highly resistive layer down to 1.15 for HEMT devices with an average donor-type impurity concentration of $2.5 \times 10^{17}$ atoms/cm$^3$. Of course, as previously discussed in connection with FIGS. 3 and 4, the average concentration of the donor-type impurity should not exceed the average concentration of C in the highly resistive layer of the HEMT devices in order to maintain the highly resistive nature of the layer.

Figure 7:
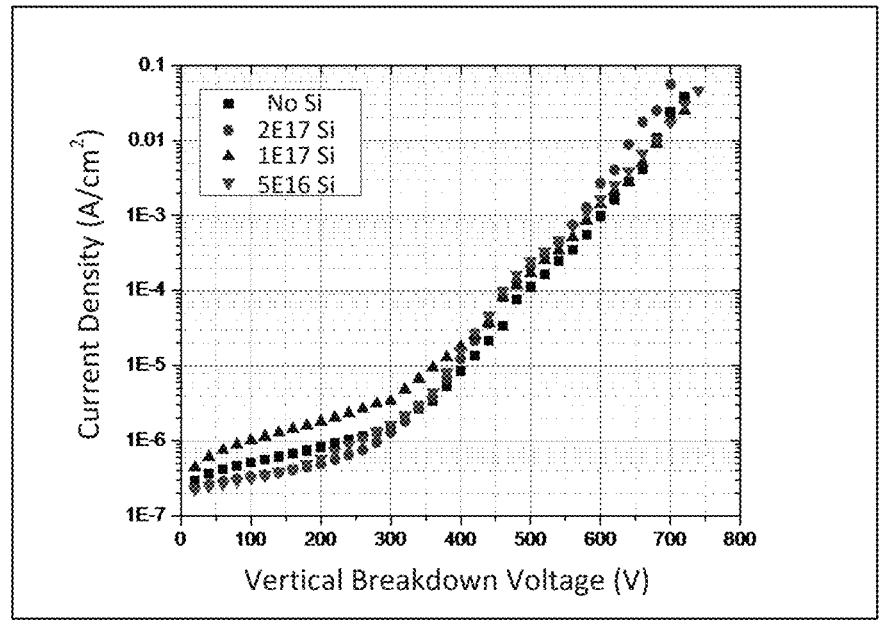
FIG. 7 shows a plot of the vertical leakage current and breakdown voltage characteristics of a plurality of HEMT devices containing a highly resistive GaN layer co-doped with C and varying concentrations of a donor-type impurity, according to one embodiment of the invention.
Figure 8:
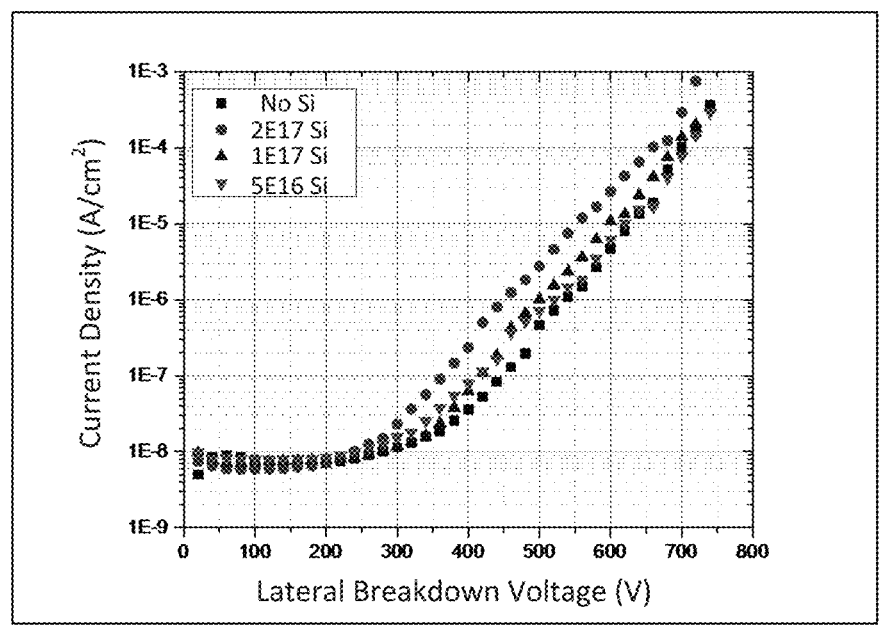
FIG. 8 shows a plot of the lateral leakage current and breakdown voltage characteristics of a plurality of HEMT devices containing a highly resistive GaN layer co-doped with C and varying concentrations of a donor-type impurity, according to one embodiment of the invention.

FIG. 7 shows a plot of the vertical leakage current and breakdown voltage characteristics of a plurality of HEMT devices containing a highly resistive GaN layer co-doped with C and varying concentrations of a donor-type impurity, according to one embodiment of the invention. FIG. 8 shows a plot of the lateral leakage current and breakdown voltage characteristics of a plurality of HEMT devices containing a highly resistive GaN layer co-doped with C and varying concentrations of a donor-type impurity, according to one embodiment of the invention. Again, as with FIGS. 5 and 6, the HEMT devices each contain a highly resistive layer doped with an average concentration of C of $1 \times 10^{18}$ atoms/cm$^3$, and varying average concentrations of a donor-type impurity, Si, of $5 \times 10^{16}$ atoms/cm$^3$, $1 \times 10^{17}$ atoms/cm$^3$, and $2.5 \times 10^{17}$ atoms/cm$^3$.

As shown in FIGS. 7 and 8, the vertical leakage current, vertical breakdown voltage, lateral leakage current, and lateral breakdown voltage characteristics are not substantially affected by co-doping the highly resistive layer with a donor-type impurity. In fact, each of the HEMT devices with Si co-doping in the highly resistive layer exhibits nearly identical vertical and lateral electrical characteristics as compared to the HEMT device with no intentional Si co-doping in the highly resistive layer. Taken together, FIGS. 4-7 indicate that co-doping the highly resistive layer of HEMT devices with sufficient average concentrations of C and a donor-type impurity successfully suppresses the current collapse caused by the C doping in the highly resistive layer, while maintaining the desired low leakage current and high breakdown voltage characteristics HEMT devices are known for.

Figure 9A:
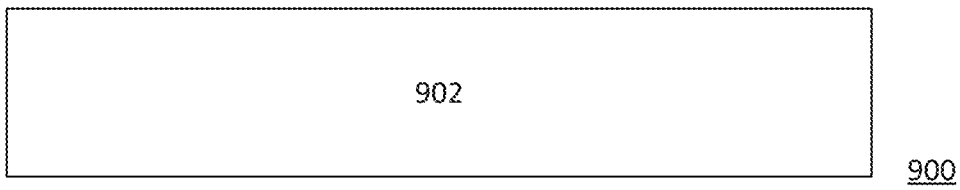
FIGS. 9A-9G shows cross-sectional views of the manufacturing steps for producing an HEMT device containing a highly resistive layer co-doped with C and a donor-type impurity, according to one embodiment of the invention.
Figure 9B:
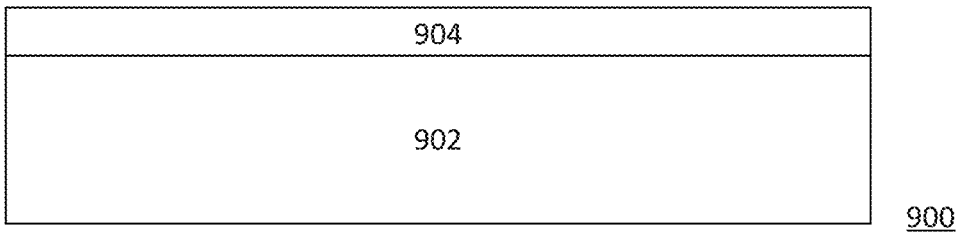

FIGS. 9A-9G shows cross-sectional views of the manufacturing steps for producing an HEMT device containing a highly resistive layer co-doped with C and a donor-type impurity, according to one embodiment of the invention. In FIG. 9A, the formation of HEMT device 900 begins by providing a substrate 902. Substrate 902 can be Si, SiC, Al$_2$O$_3$, bulk GaN, or any other suitable substrate material for epitaxially growing a group III-V material. In FIG. 9B, a buffer layer 904 is grown on the substrate 902. Buffer layer 904 can be GaN, AlGaN, AlN, or any other suitable material for growing high-quality layers of group III-V materials, or combinations thereof. Buffer layer 904 may be grown by any conventional means, such as placing substrate 302 in a MOCVD reactor and epitaxially growing the buffer layer 904 on the top surface of the substrate 902. Alternatively, the buffer layer 904 may be grown using MBE, or any other suitable growth technique. In one embodiment, the buffer layer 904 is grown to a thickness between 150 Å and 40,000 Å.

Figure 9C:
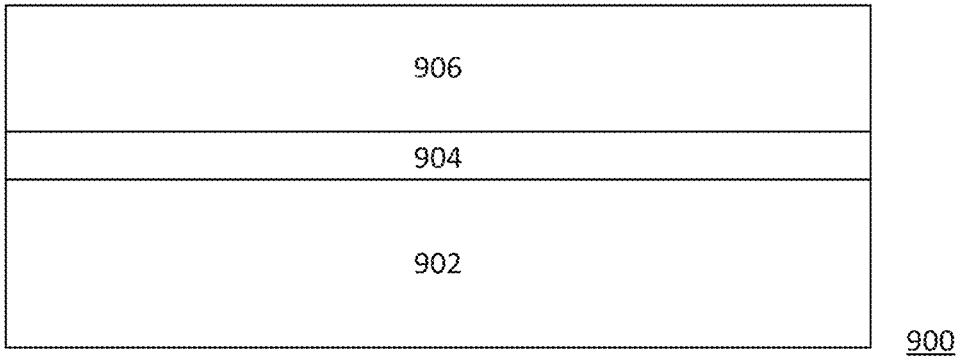

In FIG. 9C, a GaN layer 906 is epitaxially grown on the buffer layer 904. Like the buffer layer 904, the GaN layer 906 may be grown using any suitable process, including MOCVD or MBE. In one embodiment, the GaN layer 906 is un-doped. In this embodiment, the GaN layer 906 is grown in conditions that suppress the incorporation of impurities in the GaN layer 906. These growth conditions include a high ratio of group V precursors to group III precursors, high temperature and pressure, and a low growth rate. In one embodiment, the GaN layer 906 is grown with a ratio of group V precursors to group III precursors between 1500 and 4000. In one embodiment, the GaN layer 906 is grown at temperature (measured at the wafer) between 1000° C. and 1100° C. In one embodiment, the GaN layer 906 is grown at a pressure between 100 torr and 400 torr. In one embodiment, the GaN layer 906 is grown at a rate not more than 4 μm/hr.

The GaN layer 906 is optional (it provides a high-quality surface to form subsequent layers of the HEMT device 900), and in one embodiment, subsequent layers of the HEMT device 900 are grown directly on the buffer layer 904. In one embodiment, the GaN layer 906 has a thickness up to 1 μm.

Figure 9D:
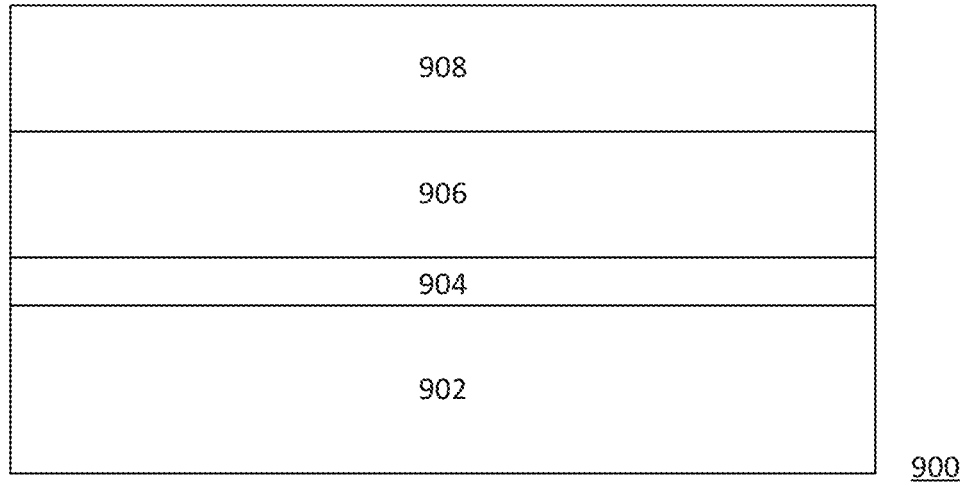

In FIG. 9D, a highly resistive layer 908 is epitaxially grown on the GaN layer 906. The highly resistive layer 908 comprises a group III-V material. In one embodiment, the highly resistive layer 908 comprises GaN. The highly resistive layer 908 may be grown using any suitable process, including MOCVD or MBE. The highly resistive layer 908 is grown under conditions that promote the incorporation of C into the highly resistive layer 908. These growth conditions include a low ratio of group V precursors to group III precursors, low temperature and pressure, and a high growth rate. In the embodiment where the highly resistive layer 908 comprises GaN, growing the highly resistive layer 908 may be accomplished simply by modifying one or more of the growth conditions following the epitaxial growth of the GaN layer 906. For example, the ratio of the group V precursors to group III precursors may be lowered, the temperature and pressure may be lowered, the growth rate may be increased, or any combination of the foregoing.

In order to co-dope the highly resistive layer 908 with a donor-type impurity, the donor-type impurity is introduced during the growth of the highly resistive layer 908. For example, in one embodiment, the donor-type impurity is Si. During the epitaxial growth of the highly resistive layer 908 under conditions that promote the incorporation of C into the highly resistive layer 908, 100 ppm of silane (SiH$_4$) diluted in N is injected into the MOCVD chamber, resulting in the highly resistive layer 908 being co-doped with C and Si. A similar approach may be taken to introduce any other suitable donor-type impurity, such as O.

In one embodiment, the highly resistive layer 908 has an average concentration of C that is $5 \times 10^{16}$ atoms/cm$^3$ or more throughout the highly resistive layer 908. In one embodiment, the highly resistive layer 908 has an average concentration of the donor-type impurity that is $5 \times 10^{15}$ atoms/cm$^3$ or more throughout the highly resistive layer 908. The ratio of the average concentration of the donor-type impurity compared to an average concentration of C throughout the highly resistive layer 908 is greater than 1:100, and less than 1:1. In one embodiment, the highly resistive layer 908 has a sheet resistance greater than 2300 Ohms/sq. In one embodiment, the highly resistive layer 908 is grown to a thickness between 0.25 μm and 6 μm.

In one embodiment, donor-type impurity is incorporated into the highly resistive layer 908 such that the concentration of the donor-type impurity is substantially uniform throughout the highly resistive layer 908. In one embodiment, the variance of the concentration of the donor-type impurity is less than 15% throughout the highly resistive layer 908. In one embodiment, the concentration of the donor-type impurity is higher at the upper surface of the highly resistive layer 908 than the average concentration of the donor-type impurity throughout the highly resistive layer 908. In order to accomplish this, more of the donor-type impurity is introduced during the epitaxial growth of the upper region of the highly resistive layer 908. In another embodiment, the concentration of the donor-type impurity is higher at the lower surface of the highly resistive layer 908 than the average concentration of the donor-type impurity throughout the highly resistive layer 908. In this embodiment, more of the donor-type impurity is introduced at the start of the epitaxial growth of the highly resistive layer 908.

By varying the amount of the donor-type impurity introduced during the epitaxial growth of the highly resistive layer 908, the concentration of the donor-type impurity can be correspondingly varied throughout the highly resistive layer 908. Similarly, the growth conditions of the highly resistive layer 908 may also be varied to vary the concentration of the C throughout the highly resistive layer.

As previously discussed in connection with FIG. 2, co-doping the highly resistive layer 908 with a donor-type impurity improves the efficiency of the C that is incorporated (i.e. more C is incorporated as a desired acceptor-type), so less overall C is required to form the highly resistive layer 908. Thus, co-doping with C and a donor-type impurity allows the epitaxial growth of the highly resistive layer 908 to be done under growth conditions that result in a higher quality material. In one embodiment, the highly resistive layer 908 is grown using a ratio of group V to group III precursors between 200 and 1400. In one embodiment, the highly resistive layer 908 is grown at a pressure between 25 torr and 150 torr. In one embodiment, the highly resistive layer 908 is grown at a temperature (measured at the wafer) between 900° C. and 1000° C. In one embodiment, the highly resistive layer 908 is grown at a rate between 5 μm/hr and 9 μm/hr.

Figure 9E:
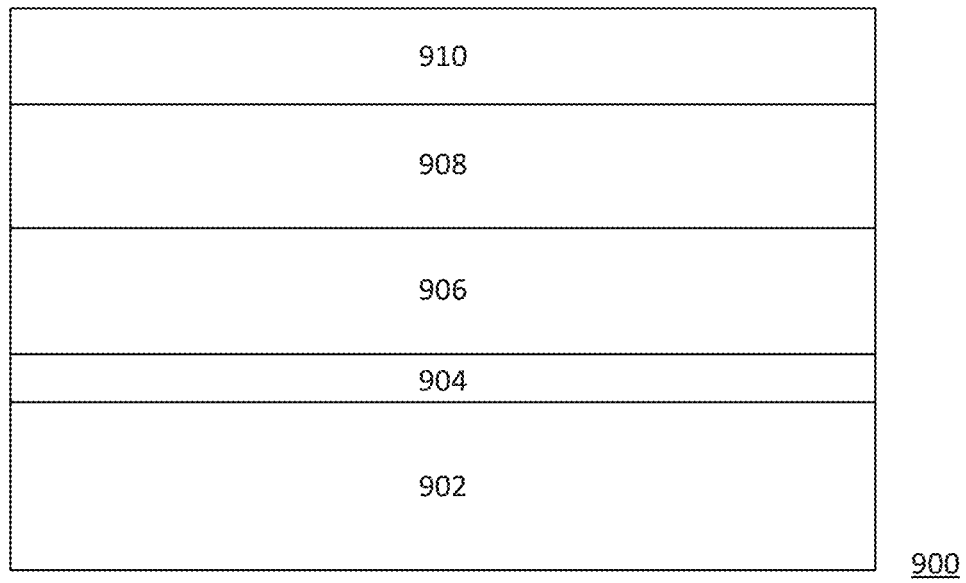

In FIG. 9E, a channel layer 910 is epitaxially grown on the highly resistive layer 908. The channel layer 910 comprises a group III-V material. In one embodiment, the channel layer 910 comprises GaN. The channel layer 910 may be grown using any suitable process, including MOCVD or MBE. In one embodiment, the channel layer 910 is un-doped. In this embodiment, the channel layer 910 is epitaxially grown in conditions that suppress the incorporation of impurities in the channel layer 910. These growth conditions include a high ratio of group V precursors to group III precursors, high temperature and pressure, and a low growth rate. In one embodiment, the channel layer 910 is grown using a ratio of group V precursors to group III precursors between 1500 and 4000. In one embodiment, the channel layer 910 is grown at a temperature (measured at the wafer) between 1000° C. and 1100° C. In one embodiment, the channel layer 910 is grown at a pressure between 100 torr and 400 torr. In one embodiment, the channel layer 910 is grown at a rate not more than 4 μm/hr. In one embodiment, the channel layer is grown to a thickness between 120 nm and 4 μm.

Figure 9F:
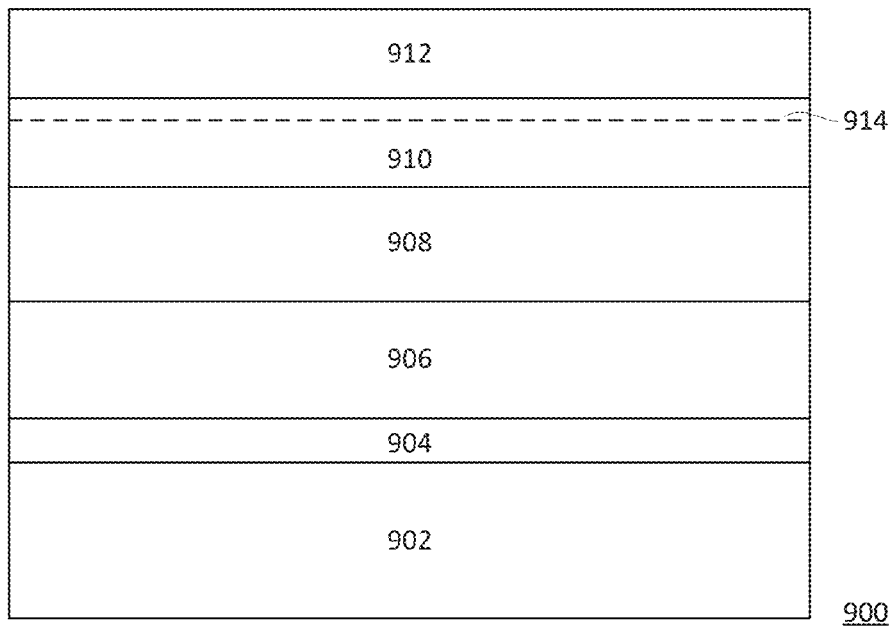

In FIG. 9F, a barrier layer 912 is epitaxially grown on the channel layer 910. The barrier layer 912 comprises a material suitable for forming a heterojunction with the channel layer 910, resulting in a 2DEG 914 at the heterojunction. The material and thickness of the barrier layer 912 is preferably selected to achieve a charge density in the 2DEG 914 between $5.5 \times 10^{12}$ C/cm$^2$ to $8 \times 10^{12}$ C/cm$^2$. For example, in one embodiment, the channel layer 910 comprises GaN and the barrier layer 912 comprises AlGaN. The barrier layer 912 has an Al composition of 21%, and is grown to a thickness of 300 Å. In other embodiments, the Al composition of the barrier layer 912 may be greater than 21%, in which case the barrier layer 912 may be thinner than 300 Å to achieve a charge density in the 2DEG 914 between $5.5 \times 10^{12}$ C/cm$^2$ to $8 \times 10^{12}$ C/cm$^2$. And conversely, when the Al composition of the barrier layer 912 is lower than 21%, the barrier layer 912 may be made thicker than 300 Å to achieve the desired charge density in the 2DEG 914.

Figure 9G:
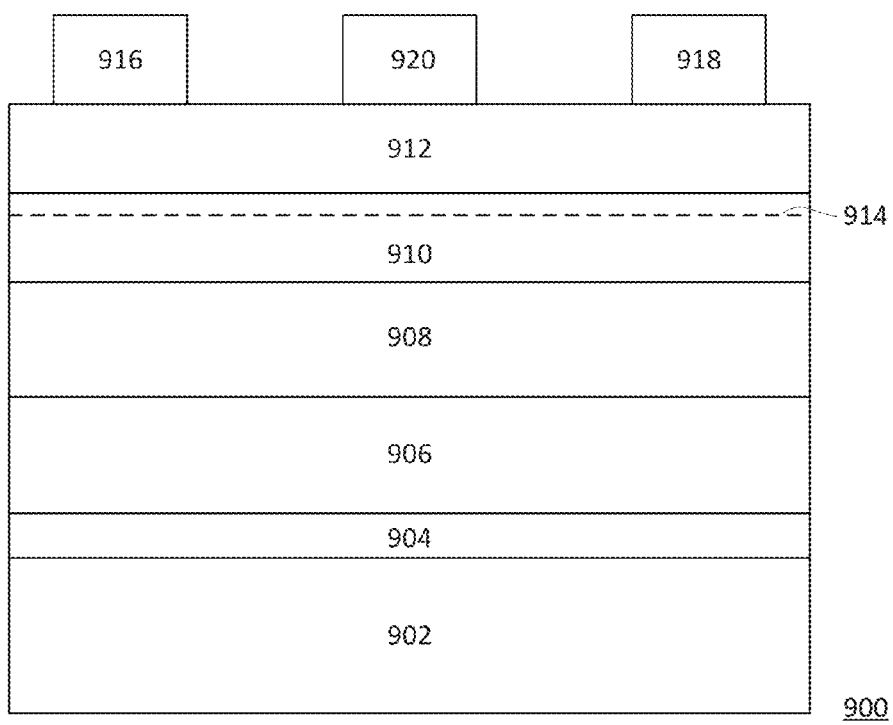

In FIG. 9G, a source electrode 916, a drain electrode 918, and a gate electrode 920 are formed on top of the barrier layer 912 using known deposition, photolithography, and etching processes. The gate electrode 920 is formed between the source electrode 916 and the drain electrode 918. The source electrode 916, drain electrode 918, and gate electrode 920 are electrically coupled to the barrier layer 912. Source electrode 916 and drain electrode 918 may comprise any material suitable to form an ohmic contact with the barrier layer 912, such as Al, Si, Ti, Ni, W, or any combination or alloy thereof. The gate electrode 920 forms a non-ohmic contact with the barrier layer 912. The gate electrode 920 may comprise any suitable material, including Ti, Ni, Al, W, Mo, or any combination or alloy thereof.

Similar to the HEMT device 200 shown in FIG. 2, the HEMT device 900 manufactured by the process described in FIGS. 9A-G will have an improved current collapse ratio while maintaining similar vertical leakage and breakdown and lateral leakage and breakdown characteristics compared to conventional HEMT devices without a highly resistive layer 908 co-doped with C and a donor-type impurity. Moreover, the current-collapse ratio of the HEMT devices 900 μmanufactured by the process described in FIGS. 9A-G will also have reduced variation between the current collapse ratio, making them suitable for commercial end products, and may replace traditional Si-based transistor devices.

Other objects, advantages and embodiments of the various aspects of the present invention will be apparent to those who are skilled in the field of the invention and are within the scope of the description and the accompanying Figures. For example, but without limitation, structural or functional elements might be rearranged, or method steps reordered, consistent with the present invention. Similarly, principles according to the present invention could be applied to other examples, which, even if not specifically described here in detail, would nevertheless be within the scope of the present invention.

What is claimed is:

1. A high electron mobility transistor device comprising:
   a substrate;
   a highly resistive layer having a lower surface facing the substrate and an upper surface opposing the lower surface, and having a sheet resistance greater than 2300 Ohms/sq formed above the substrate;
   a channel layer formed above the upper surface of the highly resistive layer; and
   a barrier layer formed above the channel layer, wherein the highly resistive layer is co-doped with carbon and a donor-type impurity, the donor-type impurity has an average concentration of $5 \times 10^{15}$ atoms/cm$^3$ or more throughout the resistive layer, a ratio of the average concentration of the donor-type impurity and an average concentration of carbon throughout the resistive layer is greater than 1:1000 and less than 1:1, and a concentration of the donor-type impurity is higher at the upper surface or the lower surface than an average concentration of the donor type impurity from the lower surface to the upper surface.

2. The high electron mobility transistor device of claim 1, further comprising:
a source electrode electrically coupled to the barrier layer;
a drain electrode electrically coupled to the barrier layer; and
a gate electrode electrically coupled to the barrier layer between the source and the drain electrodes.

3. The high electron mobility transistor device of claim 1, further comprising:
a buffer layer between the substrate and the highly resistive layer.

4. The high electron mobility transistor device of claim 1, further comprising:
a layer of gallium nitride between the substrate and the highly resistive layer.

5. The high electron mobility transistor device of claim 1, wherein a variance of a concentration of the donor-type impurity is less than 15% throughout the highly resistive layer.

6. The high electron mobility transistor device of claim 1, wherein the concentration of the donor-type impurity is higher at the upper surface of the highly resistive layer facing the channel layer than the average concentration of the donor-type impurity throughout the highly resistive layer.

7. The high electron mobility transistor device of claim 1, wherein the concentration of the donor-type impurity is higher at the lower surface of the highly resistive layer facing the substrate than the average concentration of the donor-type impurity throughout the highly resistive layer.

8. The high electron mobility transistor device of claim 1, wherein the donor-type impurity is silicon.

9. The high electron mobility transistor device of claim 1, wherein the donor-type impurity is oxygen.

10. The high electron mobility transistor device of claim 1, wherein the highly resistive layer comprises gallium nitride.

11. The high electron mobility transistor device of claim 1, wherein the channel layer comprises gallium nitride.

12. The high electron mobility transistor device of claim 1, wherein the barrier layer comprises aluminum gallium nitride.

13. The high electron mobility transistor device of claim 3, wherein the buffer layer comprises at least one of aluminum gallium nitride and aluminum nitride.

14. The high electron mobility transistor device of claim 1, wherein the highly resistive layer has a thickness between 0.25 μm and 6 μm.

15. The high electron mobility transistor device of claim 1, wherein the channel layer has a thickness between 120 nm and 4 μm.

16. The high electron mobility transistor device of claim 3, wherein the buffer layer has a thickness between 150 Å and 40,000 Å.

17. The high electron mobility transistor device of claim 12, wherein the barrier layer has a thickness and a concentration of aluminum corresponding to a charge density in the channel layer between $5.5 \times 10^{12}$ $C/cm^2$ to $8 \times 10^{12}$ $C/cm^2$.

18. A method of forming a high electron mobility transistor device, the method comprising:
providing a substrate;
forming a highly resistive layer co-doped with carbon and a donor-type impurity above the substrate, the highly resistive layer having a lower surface facing the substrate and an upper surface opposing the lower surface, the highly resistive layer having a sheet resistance greater than 2300 Ohms/sq;
forming a channel layer above the highly resistive layer; and
forming a barrier layer above the channel layer, wherein the donor-type impurity has an average concentration of $5 \times 10^5$ atoms/$cm^3$ or more throughout the highly resistive layer, a ratio of the average concentration of the donor-type impurity and an average concentration of carbon throughout the highly resistive layer is greater than 1:1000 and less than 1:1, and a concentration of the donor-type impurity is higher at the upper surface or the lower surface than an average concentration of the donor type impurity from the lower surface to the upper surface.

19. The method of claim 18, further comprising:
forming a source electrode electrically coupled to the barrier layer;
forming a drain electrode electrically coupled to the barrier layer; and
forming a gate electrode electrically coupled to the barrier layer between the source and drain electrodes.

20. The method of claim 18, further comprising:
forming a buffer layer between the substrate and the highly resistive layer.

21. The method of claim 18, further comprising:
forming a layer of gallium nitride between the substrate and the highly resistive layer.

22. The method of claim 18, wherein a variance of a concentration of the donor-type impurity is less than 15% throughout the highly resistive layer.

23. The method of claim 18, wherein the concentration of the donor-type impurity is higher at the upper surface of the highly resistive layer facing the channel layer than the average concentration of the donor-type impurity throughout the highly resistive layer.

24. The method of claim 18, wherein the concentration of the donor-type impurity is higher at the lower surface of the highly resistive layer facing the substrate than the average concentration of the donor-type impurity throughout the highly resistive layer.

25. The method of claim 18, wherein the donor-type impurity is silicon.

26. The method of claim 18, wherein the donor-type impurity is oxygen.

27. The method of claim 18, wherein the highly resistive layer comprises gallium nitride.

28. The method of claim 18, wherein the channel layer comprises gallium nitride.

29. The method of claim 18, wherein the barrier layer comprises aluminum gallium nitride.

30. The method of claim 20, wherein the buffer layer comprises at least one of aluminum gallium nitride and aluminum nitride.

31. The method of claim 27, wherein forming the highly resistive layer co-doped with carbon and the donor-type impurity comprises:
growing the highly resistive layer in conditions such that carbon incorporation in the gallium nitride is promoted while simultaneously introducing the donor-type impurity.

32. The method of claim 25, wherein the donor-type impurity is introduced by injecting silane while growing the highly resistive layer.

33. The method of claim 31, wherein the growth conditions comprise a low ratio of group V precursors to group III precursors.

34. The method of claim 33, wherein the ratio of group V precursors to group III precursors is between 200 and 1400.

35. The method of claim 31, wherein the growth conditions comprise growing the highly resistive layer at a pressure between 25 torr and 150 torr.

36. The method of claim 31, wherein the growth conditions comprise growing the highly resistive layer at a temperature between 900° C. and 1000° C.

37. The method of claim 31, wherein the growth conditions comprise growing the highly resistive layer at a rate between 5 µm/hr and 9 µm/hr.

38. The method of claim 18, wherein the highly resistive layer is grown to a thickness between 0.25 µm and 6 µm.

39. The method of claim 18, wherein the channel layer is grown to a thickness between 120 nm and 4 µm.

40. The method of claim 20, wherein the buffer layer has a thickness between 150 Å and 40,000 Å.

41. The method of claim 29, wherein the barrier layer is grown to a thickness and having an aluminum concentration corresponding to a charge density in the channel layer between $5.5 \times 10^{12}$ C/cm$^2$ to $8 \times 10^{12}$ C/cm$^2$.

* * * * *